United States Patent
Ploss et al.

(10) Patent No.: US 11,888,024 B2
(45) Date of Patent: Jan. 30, 2024

(54) METHOD OF FORMING A SEMICONDUCTOR DEVICE

(71) Applicant: Infineon Technologies AG, Neubiberg (DE)

(72) Inventors: Reinhard Ploss, Unterhaching (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 190 days.

(21) Appl. No.: 17/404,278

(22) Filed: Aug. 17, 2021

(65) Prior Publication Data

US 2021/0376068 A1     Dec. 2, 2021

Related U.S. Application Data

(63) Continuation of application No. 16/455,960, filed on Jun. 28, 2019, now Pat. No. 11,139,369, which is a
(Continued)

(30) Foreign Application Priority Data

Dec. 23, 2015   (DE) ...................... 10 2015 122 833.5

(51) Int. Cl.
   *H01L 29/06*   (2006.01)
   *H01L 21/04*   (2006.01)
   (Continued)

(52) U.S. Cl.
   CPC ........ *H01L 29/0634* (2013.01); *H01L 21/046* (2013.01); *H01L 21/0455* (2013.01);
   (Continued)

(58) Field of Classification Search
   CPC ....... H01L 21/26513; H01L 21/823807; H01L 29/105; H01L 29/1083; H01L 29/7835
   See application file for complete search history.

(56) References Cited

U.S. PATENT DOCUMENTS 6,534,836 B1   3/2003 Osanai
6,610,572 B1   8/2003 Takei et al.
(Continued)

FOREIGN PATENT DOCUMENTS

DE   102012023512 A1   6/2013
DE   102015108929 A1   12/2015
(Continued)

*Primary Examiner* — Tony Tran
(74) *Attorney, Agent, or Firm* — Harrity & Harrity, LLP

(57) ABSTRACT

A method of forming a semiconductor device includes forming a trench in a semiconductor body; at least partially filling the trench with a filling material; introducing dopants into a portion of the filling material; and applying a first thermal processing to the semiconductor body to spread the dopants in the filling material along a vertical direction of the filling material by a diffusion process. The vertical doping profile of the dopants within the doped filling material is shaped during the first thermal processing. Additionally, the dopants are substantially confined to within the trench and substantially do not diffuse from the doped filling material into the semiconductor body during the first thermal processing. A second thermal processing is applied to the semiconductor body after the first thermal processing to cause diffusion of the dopants from the doped filling material into the semiconductor body adjoining the trench.

22 Claims, 7 Drawing Sheets

Related U.S. Application Data continuation of application No. 15/385,137, filed on Dec. 20, 2016, now Pat. No. 10,340,335.

(51) Int. Cl.
| | | |
|---|---|---|
| *H01L 21/225* | (2006.01) | |
| *H01L 21/263* | (2006.01) | |
| *H01L 21/265* | (2006.01) | |
| *H01L 21/3065* | (2006.01) | |
| *H01L 21/324* | (2006.01) | |
| *H01L 29/16* | (2006.01) | |
| *H01L 21/3115* | (2006.01) | |
| *H01L 29/32* | (2006.01) | |
| *H01L 29/167* | (2006.01) | |

(52) U.S. Cl.
CPC ...... *H01L 21/0475* (2013.01); *H01L 21/2253* (2013.01); *H01L 21/2255* (2013.01); *H01L 21/263* (2013.01); *H01L 21/26513* (2013.01); *H01L 21/3065* (2013.01); *H01L 21/324* (2013.01); *H01L 29/16* (2013.01); *H01L 29/1608* (2013.01); *H01L 21/31155* (2013.01); *H01L 29/167* (2013.01); *H01L 29/32* (2013.01)

(56) References Cited

U.S. PATENT DOCUMENTS

| | | | |
|---|---|---|---|
| 8,415,671 | B2 | 4/2013 | Zhang |
| 9,048,250 | B2 | 6/2015 | Yamada et al. |
| 9,887,125 | B2 | 2/2018 | Schulze et al. |
| 10,340,335 | B2 | 7/2019 | Ploss et al. |
| 11,139,369 | B2 | 10/2021 | Ploss et al. |
| 2012/0064694 | A1* | 3/2012 | Booth, Jr. ......... H01L 29/66181 438/479 |
| 2014/0264573 | A1 | 9/2014 | Kocon et al. |
| 2015/0348784 | A1* | 12/2015 | Granahan ........... H01L 29/1095 257/622 |

FOREIGN PATENT DOCUMENTS

| | | |
|---|---|---|
| JP | S6344722 A | 2/1988 |
| JP | H05160058 A | 6/1993 |
| JP | 2000260982 A | 9/2000 |
| JP | 2001156299 A | 6/2001 |
| JP | 2001345444 A | 12/2001 |
| JP | 2002009082 A | 1/2002 |
| JP | 2007251023 A | 9/2007 |
| JP | 2013115394 A | 6/2013 |
| JP | 2014165306 A | 9/2014 |
| WO | 2015183777 A1 | 12/2015 |

* cited by examiner

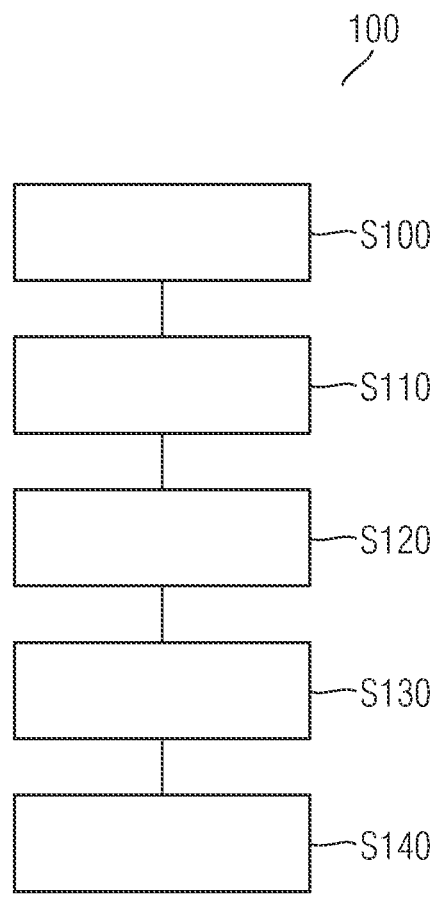

METHOD OF FORMING A SEMICONDUCTOR DEVICE

CROSS-REFERENCE TO RELATED APPLICATIONS

This application is a continuation of U.S. patent application Ser. No. 16/455,960 filed on Jun. 28, 2019, which is a continuation of U.S. patent application Ser. No. 15/385,137 filed Dec. 20, 2016, which claims the benefit of German Patent Application No. 10 2015 122 833.5 filed Dec. 23, 2015, which are incorporated by reference as if fully set forth.

BACKGROUND

Semiconductor devices, for example diodes, insulated gate field effect transistors (IGFETs) such as metal oxide semiconductor field effect transistors (MOSFETs), insulated gate bipolar transistors (IGBTs) include a semiconductor body with doped zones that define the functionality of the semiconductor device. A great depth and a precise doping profile is desirable for a variety of doped regions such as super-junction structures, edge termination area regions, body regions, floating semiconductor regions, or base regions, for example. In super-junction semiconductor devices, a reproducible doping being homogeneous along a lateral direction and adjustable along a vertical direction may enable adjustment of an electric field profile, for example electric field strength peaks for improving avalanche robustness. A vertical junction termination comprising regions of varying doping concentration along the vertical direction may improve a trade-off between low area consumption and large breakdown voltage capability. Modification of well-known Gaussian doping profiles may improve electric characteristics of semiconductor devices, for example latch-up robustness of insulated gate bipolar transistors (IGBTs).

It is desirable to provide a method for manufacturing a semiconductor device that may enable great depths and precise doping profiles of doped semiconductor regions.

SUMMARY

The present disclosure relates to a method of forming a semiconductor device. The method comprises forming a trench in a semiconductor body at a first surface of the semiconductor body. The method further comprises introducing dopants into a first region at a bottom side of the trench by ion implantation. The method further comprises forming a filling material in the trench. The method further comprises introducing dopants into a second region at a top side of the filling material. The method further comprises thermal processing of the semiconductor body configured to intermix the dopants from the first and second regions by a diffusion process along a vertical direction perpendicular to the first surface.

The present disclosure also relates to another method of forming a semiconductor device. The method comprises forming a trench in a silicon carbide semiconductor body at a first surface of the semiconductor body. The method further comprises forming a filling material in the trench. The method further comprises introducing dopants into a part of the filling material. The method further comprises thermal processing of the silicon carbide semiconductor body configured to spread the dopants in the filling material along a vertical direction between a bottom side and a top side of the trench by a diffusion process. The method further comprises introducing the dopants from the filling material into the silicon carbide semiconductor body by a diffusion process caused by thermal processing of the silicon carbide semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. Other embodiments will be readily appreciated in reference to the following detailed description.

FIG. 1 is a schematic flow diagram for illustrating a method of manufacturing a semiconductor device;

DETAILED DESCRIPTION

Figure 2A:
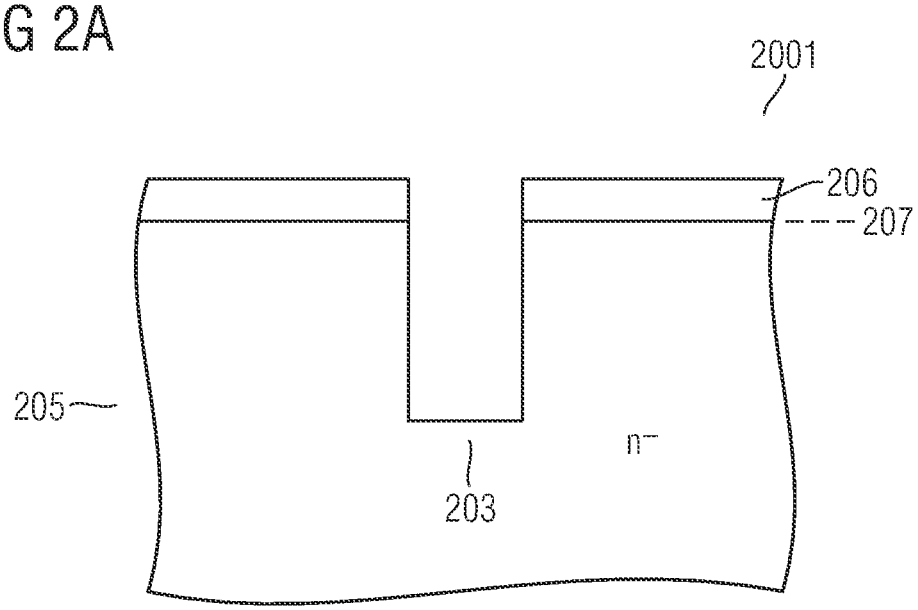
FIGS. 2A to 2J are cross-sectional views of a semiconductor body for illustrating processes of a method of manufacturing a semiconductor device.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n⁻" means a doping concentration that is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also FZ (Float-Zone) silicon wafers may be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g. along four orthogonal directions in the plane of the tape. By dicing and pulling the tape, the semiconductor wafer gets divided into a plurality of semiconductor dies (chips).

FIG. 1 is a schematic flow diagram for illustrating a method 100 of manufacturing a semiconductor device.

It will be appreciated that while method 100 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases A schematic flow diagram for illustrating a method 100 of manufacturing a semiconductor device is depicted in FIG. 1.

Process feature S100 comprises forming a trench in a semiconductor body at a first surface of the semiconductor body. The semiconductor body may be a single crystalline semiconductor substrate comprising one or more semiconductor layers thereon. When manufacturing super-junction semiconductor devices, semiconductor layer formation and subsequent implantation of dopants, for example phosphorus (P) for n-doping in silicon may be repeated multiple times. Ion implantation may be carried out with or without an ion implantation mask, for example depending on a desired lateral doping profile. Process parameters such as a number of subsequent layer formation, thickness of each layer and dose of doping may be chosen in consideration of a target breakdown voltage and dopant diffusion parameters, for example.

The trench may be formed by selectively removing material of the semiconductor body at the first surface, for example by a masked etch process such as wet or dry etching. In some embodiments, reactive ion etching may be used, for example. In some embodiments, an etch mask is a patterned hard mask comprising a nitride layer, a carbon layer or a stack of an oxide and nitride layer, for example a stack comprising $SiO_2$, $Si_3N_4$. The etch mask may also be used as an implantation mask described with respect to process feature S110 below.

Process feature S110 comprises introducing dopants into a first region at a bottom side of the trench by ion implantation. In some embodiments, the semiconductor body is a silicon semiconductor body and the dopants comprise gallium (Ga). In some other embodiments, the semiconductor body is a silicon carbide semiconductor body and the dopants comprise boron (B) and/or gallium. The dopants and the semiconductor body may be of opposite conductivity type. When the semiconductor body is n-doped, the dopants may be p-type. When the semiconductor body is p-doped, the dopants may be n-type. In some embodiments, ion implantation is carried at an inclination with respect to the vertical direction of less than 0.15°. In some embodiments, a dose of dopant implantation is set in accordance with a target degree of charge compensation. In some embodiments, an implantation energy is set high enough to avoid undesired out-diffusion of implanted dopants into an ambient caused by a high temperature budget during subsequent thermal processing. In some embodiments, the first region comprises a material corresponding to the filling material. In other words, a material corresponding to the filling material may be formed at the bottom side of the trench prior to introducing dopants into the first region by ion implantation. In some other embodiments, the first region is a part of the semiconductor body. In other words, the dopants may be implanted into the semiconductor body at the bottom side of the trench.

Process feature S120 comprises forming a filling material in the trench. In some embodiments, the filling material comprises an oxide. The oxide may be formed by lateral/vertical deposition of the oxide into the trench. A deposition temperature may be kept small for suppressing out-diffusion of dopants introduced into the filling material at a later phase of processing. Since requirements on an oxide quality are rather low, a temperature during oxide deposition or during a thermal or wet oxidation process may be minimized. Gallium as a p-type dopant in silicon has a diffusion coefficient that is substantially greater in silicon oxide, for example $SiO_2$, than in silicon. Thus, a vertical doping profile may be shaped in the filling material before introducing a substantial amount of dopants from the filling material into a surrounding part of the silicon semiconductor body, for example. Gallium being a p-type dopant in silicon or silicon carbide has a diffusion coefficient that is substantially greater in silicon oxide, for example $SiO_2$ than in silicon or silicon carbide. Thus, a vertical doping profile may be shaped in the filling material before introducing the dopants from the filling material into a surrounding part of the silicon carbide semiconductor body, for example. Other filling materials than oxide may be used provided that dopants are available, which have a greater diffusion coefficient in the filling material than in the semiconductor body surrounding the filling material. In some embodiments, a ratio of a diffusion coefficient of the dopants in the filling material and a diffusion coefficient of the dopants in the semiconductor body is greater than two, or even greater than four, or even greater than ten with respect to a temperature of 1000° C. or 1100° C. In some other embodiments, the filling material comprises polycrystalline silicon. An optional thin dielectric liner may be formed at sidewalls and at a bottom side of the trench provided that the dielectric liner can be dissipated by a subsequent thermal process. For example, an oxide liner may be dissipated by recrystallization of the polycrystalline silicon by thermal processing. The recrystallized filling material may then be used as part of a super-junction structure of the semiconductor device, for example as part of a drift zone or as part of a charge compensation region having opposite conductivity type than the drift zone.

Process feature S130 comprises introducing dopants into a second region at a top side of the trench by ion implantation. In some embodiments, the dopants introduced into the second region correspond to a dopant species of the dopants introduced into the first region. In some other embodiments, the dopants introduced into the second region are of a different dopant species than the dopants in the first region provided that the dopants have a greater diffusion coefficient in the filling material than in the semiconductor body surrounding the filling material. In some embodiments, a ratio of a diffusion coefficient of the dopants introduced into the second region of the filling material and a diffusion coefficient of the dopants in the semiconductor body is greater than two, or even greater than four, or even greater than ten with respect to a temperature of 1000° C. or 1100° C. In some embodiments, ion implantation is carried out at an inclination with respect to the vertical direction of less than 0.15°. In some embodiments, a dose of dopant implantation is set in accordance with a target degree of charge compensation. In some embodiments, an implantation energy is set high enough to avoid undesired out-diffusion of implanted dopants into an ambient caused by a high temperature budget during subsequent thermal processing. The same mask may be used for trench etching and subsequent ion implantation. The first and second regions may be portions of the filling material or of a continuous material corresponding to the filling material.

Process feature S140 comprises thermal processing of the semiconductor body configured to intermix the dopants from the first and second regions by a diffusion process along a vertical direction perpendicular to the first surface. Due to the different diffusion coefficients of the dopants in the filling material and in the semiconductor body adjoining the filling material, appropriate selection of a temperature budget during thermal processing allows to intermix the dopants predominantly along a vertical direction in the filling material. A ratio of a diffusion velocity of the dopants in the filling material and a diffusion coefficient of the dopants in the semiconductor body may increase with increasing temperature during thermal processing as is the case e.g. for Ga diffusion in $SiO_2$ filling material and Si semiconductor material. Thermal processing may comprise a temperature profile including one or more temperature levels, for example.

In some embodiments, the method further comprises, prior to thermal processing, forming a diffusion barrier at the first surface of the semiconductor body. In some embodiments, the diffusion barrier is a layer or a layer stack comprising a nitride. The diffusion barrier aims at suppressing out-diffusion of the dopants via the first surface during thermal processes.

In some embodiments, the method further comprises, prior to introducing dopants into a second region at a top side of the filling material, removing a part of the filling material from the trench by a selective etch process using the etch mask that has been previously used for etching the trench. The part of the filling material removed from the trench may leave a portion of the filling material above a top side of the first region where dopants have been introduced beforehand.

The processes of removing a part of the filling material, introducing dopants into a region at a top side of the remaining filling material by an ion implantation process, and filling the trench again with the filling material may be repeated several times. Thereby, a plurality of regions comprising dopants spaced from one another along a vertical direction at equal and/or different distances may be formed. The distance(s) between the regions may be chosen in consideration of a target dopant profile to be set by thermal processing for adjusting the target dopant profile by vertical diffusion of the dopants in the filling material. The distance(s) may be smaller than 50 µm, or smaller than 30 µm, or smaller than 10 µm, or even smaller than 5 µm. In some embodiments based on a silicon semiconductor body, two, three, four, five or six regions comprising dopants introduced by ion implantation may be formed prior to vertical intermixture of the dopants by thermal processing.

In some embodiments, process features S100 to S140 may be part of a method of manufacturing p-doped regions, for example columns and/or stripes acting as compensation regions.

In some other embodiments, process features S100 to S140 may be combined with other processes for manufacturing super-junction semiconductor devices. By way of example, lower levels of the super-junction structure may be formed by the so-called multi-epitaxial growth technique where epitaxial growth and ion implantation are repeated alternately until a certain drift-layer thickness is achieved. Thereafter, additional levels of the super-junction structure may be formed by processes comprising process features S100 to S140 illustrated in FIG. 1. Thereby, a maximum trench depth for achieving a certain breakdown voltage may be reduced, for example.

In some other embodiments, process features S100 to S130 may be part of a method of manufacturing p-doped hemispherical compensation regions in the semiconductor body. Some or all of the p-doped hemispherical compensation regions may be doped by a doping process at sidewalls of the trench and/or by filling the trench with lightly doped semiconductor material, for example lightly p-doped semiconductor material after final removal of the filling material from the trench. Process feature S140 may be replaced by thermal processing of the semiconductor body configured to decrease a distance between the dopants from the first and second regions by a diffusion process along a vertical direction perpendicular to the first surface, for example without intermixture of the dopants from the first and second regions. The dopants from the first and second regions are spaced from one another, and, by additional thermal processing configured to laterally diffuse the dopants into a surrounding part of the semiconductor body, form the p-doped hemispherical compensation regions such as bubbles that may be electrically interconnected by the trench filling, for example lightly doped semiconductor material for avoiding charging effects during dynamic operation of the semiconductor device.

Process features S100 to S140 may be part of a method of manufacturing an edge termination structure, for example an edge termination region comprising a variation of vertical doping.

Process features S100 to S140 may also be part of a method of manufacturing a p-doped body region.

Process features S100 to S140 may be part of a method of manufacturing a pedestal epitaxial layer and/or a field stop region on a highly doped semiconductor substrate. On the pedestal epitaxial layer and/or the field stop region, one or more semiconductor layers of a drift zone may be formed, for example by epitaxial growth/deposition.

The process features S100 to S140 may also be combined with process features of methods for manufacturing charge compensation semiconductor devices including field plate(s).

In some embodiments, the method further comprises forming hydrogen-related donors in the semiconductor body by irradiating the semiconductor with protons, followed by thermal treatment of the semiconductor body. Thereby, a charge compensation balance may be shifted to be more n-oriented after measuring the charge imbalance, for example by measuring the breakdown voltage of the device. Proton irradiation may also be carried out at different dose and/or energy for selectively adjusting the charge compensation balance with respect to a depth of the super-junction structure.

In some embodiments, process features S100 to S140 may be applied to a plurality of trenches having equal and/or different lateral distance and dimension. By varying trench dimensions and/or lateral distances, an effective edge termination area may be formed, for example.

Some of the process features S100 to S140 may be applied to formation of a junction termination in an edge termination area. By way of example, introduction of dopants may be masked in the edge termination area when carrying out process features S100 to S140. The trench or trenches in the edge termination area may surround an active cell area, for example.

The process features S100 to S140 may be applied to any kind of charge compensation device, for example super-junction field effect transistors, super-junction insulated gate bipolar transistors (IGBTs), super-junction thyristors or any other semiconductor devices comprising a charge compensation region in a drift zone of the semiconductor device.

Process features S100 to S140 may also be part of a method of manufacturing semiconductor regions having a target doping profile varying along the vertical direction, for example part of junction termination structure. In some embodiments, a single ion implantation process of dopants, for example based on process S140 while omitting process S110, may be sufficient for realizing doped regions of a junction termination structure. Variation of vertical doping in the doped region may be adjusted by setting of process parameters of thermal processing, for example by setting of a temperature profile and a duration of thermal treatment. A diffusion barrier may be provided at the first surface of the semiconductor body for suppressing out-diffusion of dopants into an ambient above the first surface. Process features S100 to S140 may also be used for forming junction termination structures configured to block voltages of opposite polarity, for example by applying the same process for the formation of the junction termination based on a vertically varying doping concentration from the wafer backside.

Process features S100 to S140 may also be part of a method of manufacturing doped regions comprising a large depth and a precise doping profile, for example super-junction structures, edge termination area regions, body regions, floating semiconductor regions, or base regions, for example.

In some embodiments, process features may be applied to a dicing area of a semiconductor wafer for dividing the wafer into individual chips. Any technique for dicing may be applied, e.g., blade dicing (sawing), laser dicing, etching, for example. The trench in the dicing area may be broader than similar trenches in the edge termination or active area. An oxide filling or oxide liner in the trench may act as a protection layer against contamination or mechanical damage, for example.

FIGS. 2A to 2J are cross-sectional views of a semiconductor body for illustrating processes of a method of manufacturing a semiconductor device. Details of process features S100 to S140 described with reference to FIG. 1 may likewise apply.

Referring to the schematic cross-sectional view 2001 of FIG. 2A, a trench 203 is etched into an n-doped semiconductor body 205, for example a silicon semiconductor body using an etch mask 206 on a first surface 207 of the semiconductor body 205.

Figure 2B:
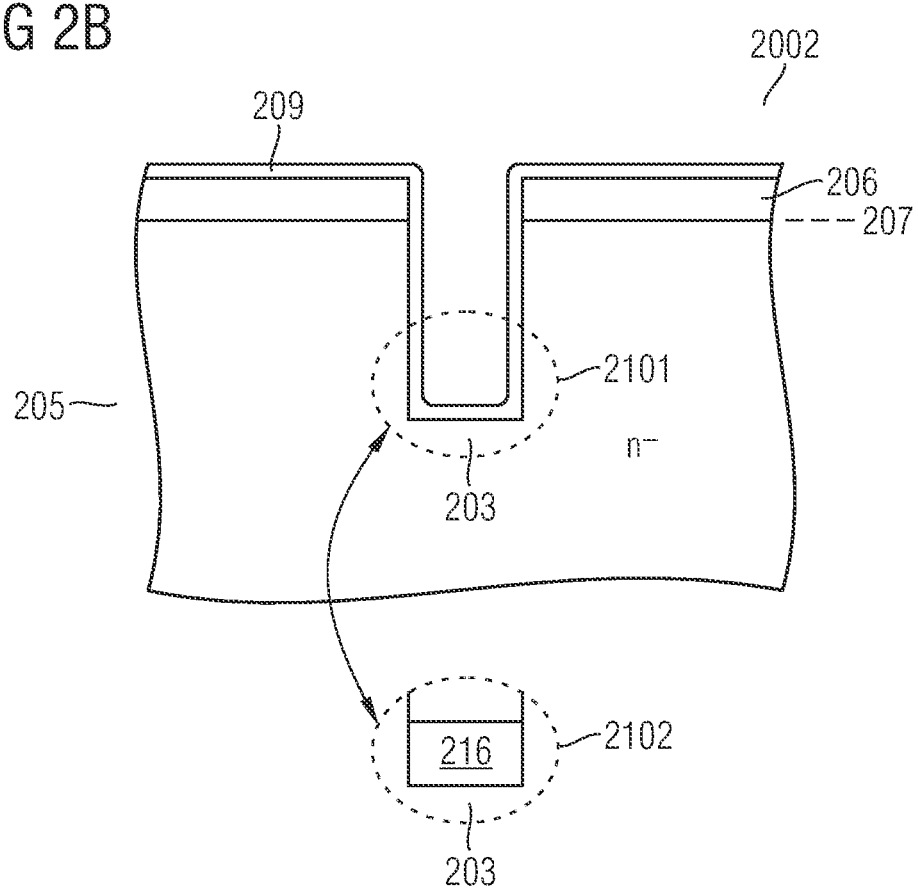

Referring to the schematic cross-sectional view 2002 of FIG. 2B, a layer 209, for example an oxide or a material corresponding to a filling material formed in the trenches at a later phase of processing, is formed in the trench and lines sidewalls and a bottom side of the trench 203. A thickness of the filling material may be smaller than 1 µm, or smaller than 500 nm, or even smaller than 300 nm. Prior to formation of the layer 209, a diffusion barrier layer, for example a nitride barrier layer such as $Si_3N_4$ may be formed at a bottom side of the trench 203 and be absent at sidewalls of the trench 203.

An alternative to lining the sidewalls and bottom side of the trench 203 with layer 209 as illustrated in an area 2101 is depicted in a circled area 2102 below the cross-sectional view of the semiconductor body 205. The layer 209 may be replaced by a filling material 216, for example oxide that is filled in the trench 203 and recessed below the first surface using the etch mask 206. The further processes described with reference to FIGS. 2C to 2J may then continue based on a structure as illustrated in the circled area 209.

Figure 2C:
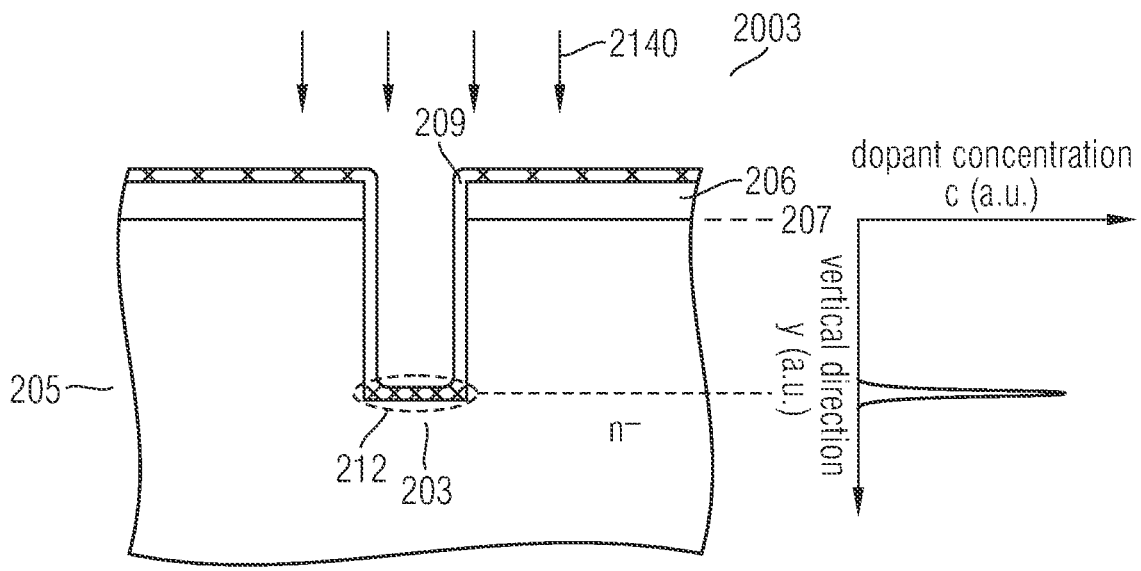

Referring to the schematic cross-sectional view 2003 of FIG. 2C, dopants are introduced into a first region 212 of the layer 209 at the bottom side of the trench 203 by ion implantation. Ion implantation through the first surface 207 is illustrated by means of arrows 2140. The etch mask 206 may also function as an ion implantation mask. Ion implantation of dopants results in a concentration profile c of dopants along a vertical direction y having a peak at a vertical level of the first region 212.

Figure 2D:
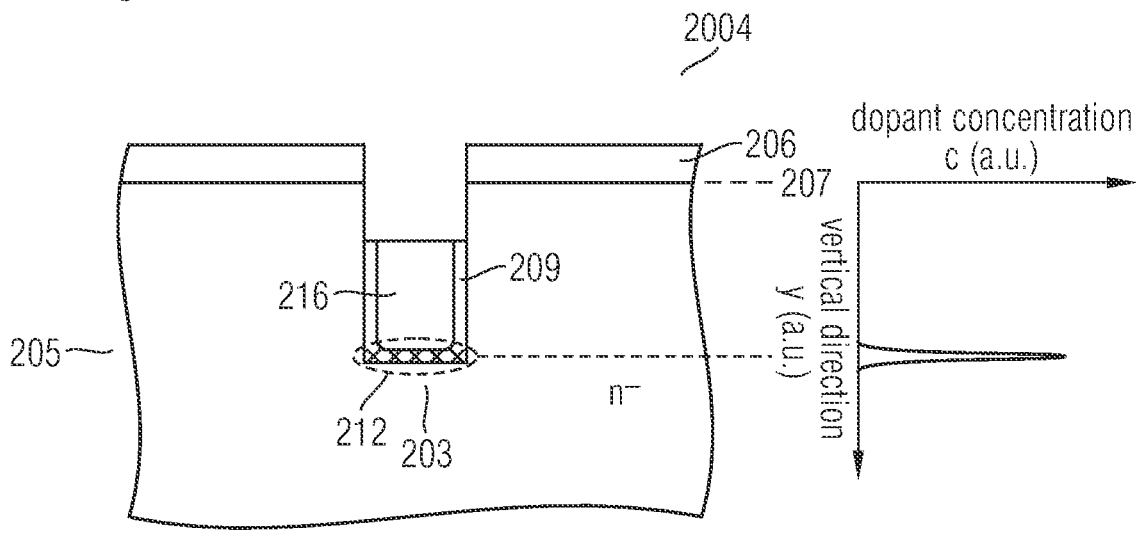

Referring to the schematic cross-sectional view 2004 of FIG. 2D, the filling material 216, for example oxide is filled in the trench 203. A part of the filling material 216 as well as a part of the layer 209 are removed from an upper part of the trench 203, for example by a dry and/or wet etching process using the same mask, i.e. the etch mask 206 that has been used beforehand when forming the trench 203.

Figure 2E:
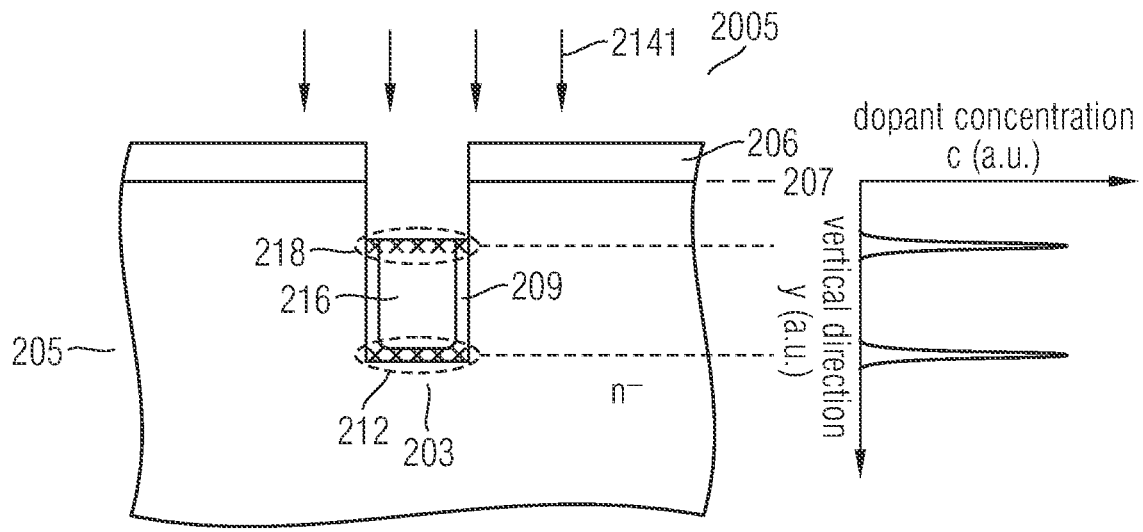

Referring to the schematic cross-sectional view 2005 of FIG. 2E, dopants are introduced into a second region 218 of the layer 209/filling material 216 at a top side of the filling material 216 by ion implantation. Ion implantation through the first surface 207 is illustrated by means of arrows 2141. The etch mask 206 may again function as an ion implantation mask. Ion implantation of dopants results in a concentration profile c of dopants along a vertical direction y having a further peak at a vertical level of the second region 218.

Figure 2F:
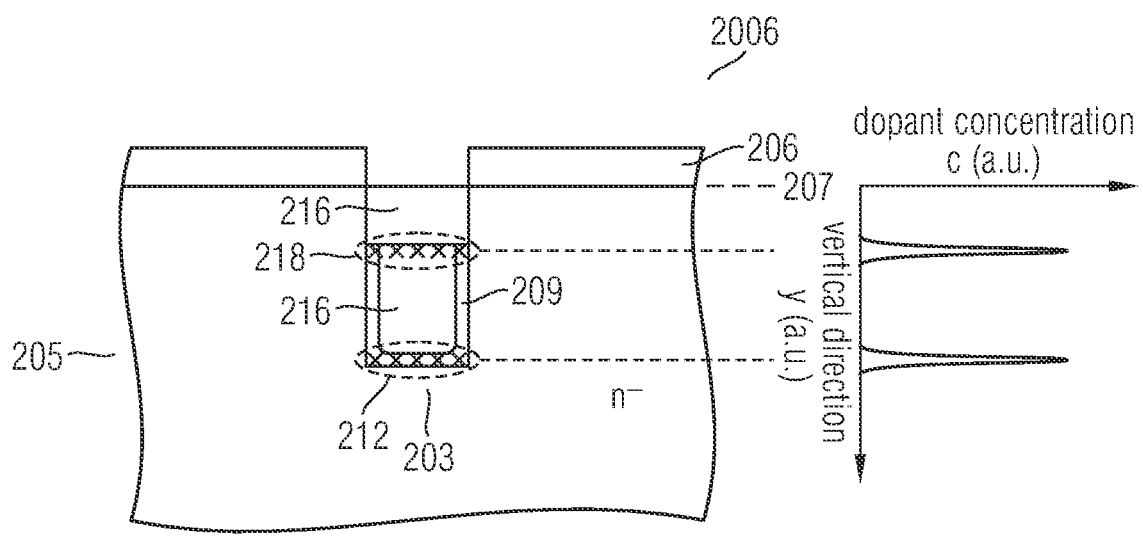

Referring to the schematic cross-sectional view 2006 of FIG. 2F, the filling material 216, for example oxide is filled in the trench 203 above the second region 218 up to a level at or around the first surface 207, for example by a deposition and a recess process. The recess process may be based on the same mask, i.e. the etch mask 206 that has been used beforehand when forming the trench 203.

Figure 2G:
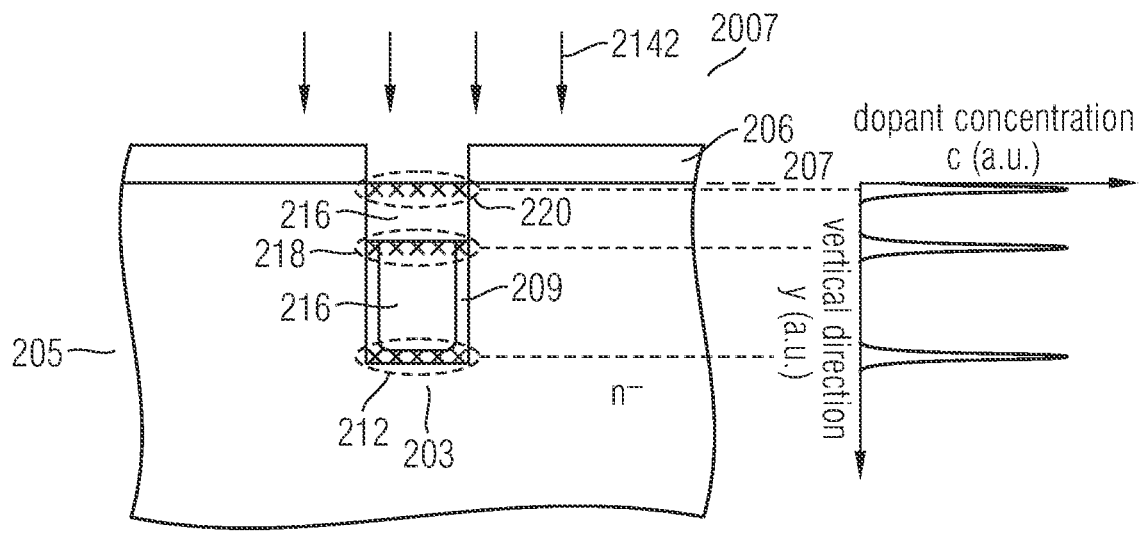

Referring to the schematic cross-sectional view 2007 of FIG. 2G, dopants are introduced into a third region 220 of the filling material 216 at a top side of the filling material 216 by ion implantation. Ion implantation through the first surface 207 is illustrated by means of arrows 2142. The etch mask 206 may again function as an ion implantation mask. Ion implantation of dopants results in a concentration profile c of dopants along a vertical direction y having a further peak at a vertical level slightly below the first surface 207.

In the embodiment illustrated in FIGS. 2A to 2G, three ion implantations of dopants have been carried out by way of example. The number of ion implantations may differ from three and the processes illustrated in FIGS. 2D to 2G may be repeated as desired, for example in view of diffusion behavior and breakdown voltage requirements.

Figure 2H:
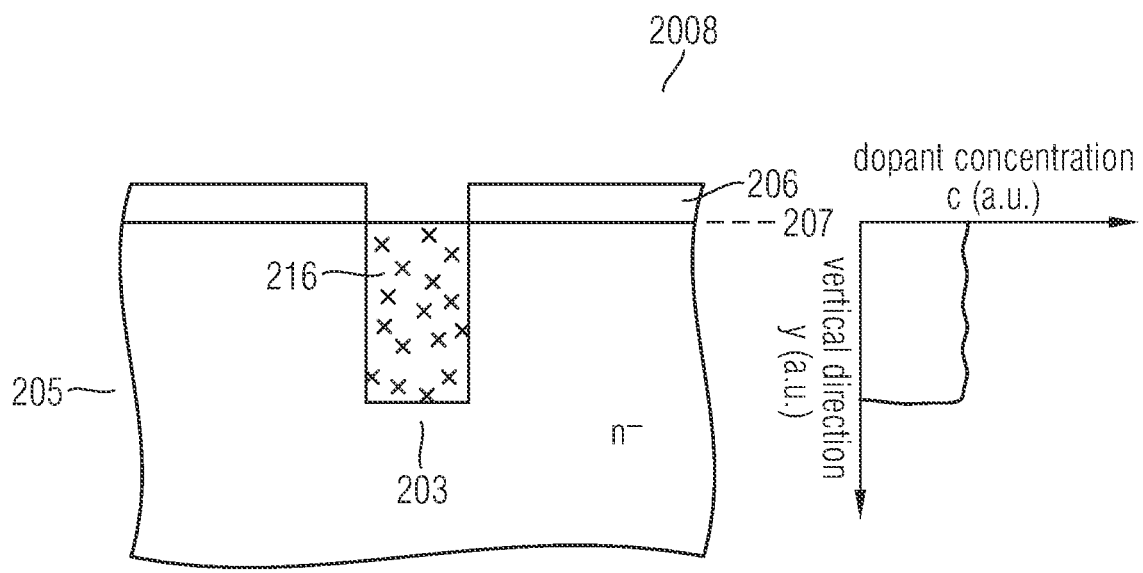

Referring to the schematic cross-sectional view 2008 of FIG. 2H, the semiconductor body 205 is processed thermally, thereby intermixing the dopants from the first to third regions 212, 218, 220 by a diffusion process along the vertical direction y and resulting in a constant or almost constant concentration c of dopants in the filled trench. Thermal processing may be carried out in thermal process equipment such as diffusion furnace systems, resistance based heating elements, and related components, for example. In some embodiments, thermal processing of the semiconductor body 205 comprises heating the semiconductor body up to temperatures in a range of 800° C. to 1300° C., or between 900° C. and 1250° C., or between 1000° C. and 1200° C. In some embodiments, heating the semiconductor body up to the temperature ranges specified above is carried out for a duration of 30 s to 10 h. In some embodiments, the semiconductor body is heated up to the temperature range specified above for a duration of 10 minutes to 5 hours. In some other embodiments, the semiconductor body is heated up to the temperature range specified above for a duration of 30 minutes to 3 hours. Thermal processing parameters such as temperature or temperature profile and/or duration may be appropriately chosen in due consideration of material properties such as a diffusion coefficient of the dopant species or a target diffusion profile to be achieved, for example. Prior to thermal processing, a diffusion barrier may be formed on the semiconductor body 205 at the first surface for avoiding out-diffusion of the dopants into an ambient during thermal processing, for example.

Figure 2I:
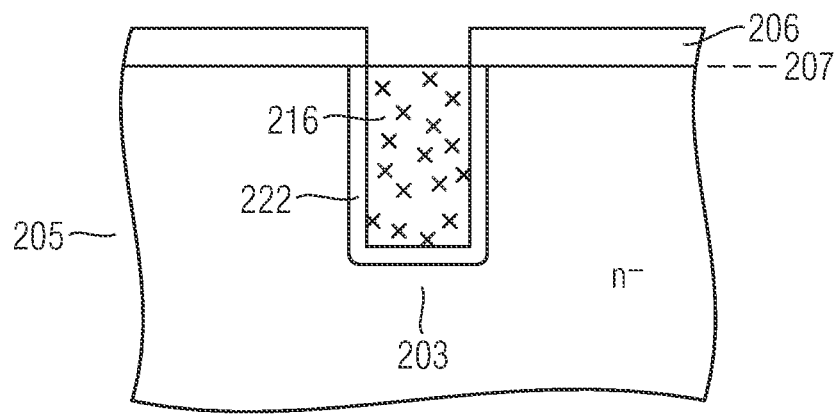

Referring to the schematic cross-sectional view 2009 of FIG. 2I, the semiconductor body 205 is again thermally processed, for example directly after the thermal treatment described with reference to FIG. 2H. The additional thermal processing may be carried out in the same thermal process equipment, for example and may directly follow thermal processing for intermixing the dopants along the vertical direction. The additional thermal processing aims at introducing the dopants into the semiconductor body 205 surrounding the trench 203, resulting in a doped region 222 of opposite conductivity type than the semiconductor body 205. Temperatures during thermal processing described with reference to FIG. 2H (temperature or average temperature $T_1$) and the additional thermal processing (temperature or average temperature $T_2$) described with reference to FIG. 2I may differ from each other. For a semiconductor body made of silicon, $T_1 > T_2$ may be fulfilled, for example and $T_1 - T_2 > 50K$, or $T_1 - T_2 > 100K$, or $T_1 - T_2 > 200K$. A ratio of a diffusion velocity of the dopants in the filling material, for example oxide and a diffusion coefficient of the dopants, for example Ga in silicon may increase with increasing temperature during thermal processing. Thermal processing may comprise a temperature profile including one or more temperature levels, for example. By these measures, a vertical homogenization of the doping material can be improved on condition of a minimum diffusion of the dopants into the semiconductor body. For a semiconductor body made of silicon carbide, a relation between $T_1$ and $T_2$ may be vice versa to silicon, i.e. $T_1<T_2$. This is caused by small diffusion coefficients of dopants in SiC.

Further processes will follow depending on the purpose of the doped region 222. In this regard, FIG. 1 and the related part of the description above provide a number of functions of the doped region 222.

When the semiconductor device is processed as a super-junction semiconductor device including a super-junction structure comprising the doped region 222 and a neighboring part of the semiconductor body 205, the filling material 216 may be removed and replaced by a semiconductor layer, for example an intrinsic or lightly doped semiconductor layer that may be formed by an epitaxial growth/deposition process. This intrinsic or lightly doped semiconductor layer may partly, for example in SiC, or completely, for example in Si, be further doped with the implanted dopants by lateral diffusion. The doped region 222 may also be removed from a bottom side of the trench 203. Further processes for forming semiconductor device elements may follow. The device elements may include semiconducting regions, for example p- and/or n-doped regions doped regions, insulating layers, for example gate and/or field dielectric(s) and/or interlayer dielectric(s) and conducting layers such as metal layer(s) for contacts and/or wirings. The semiconductor regions, for example a doped drain region, a doped source region, a doped body region, a doped anode region, a doped cathode region may be formed at the first surface by ion implantation and/or diffusion from a diffusion source, for example. A planar gate structure including a gate dielectric and a gate electrode or a gate structure including a gate dielectric and a gate electrode in a trench may be formed by thermal oxidation and/or layer deposition of the gate dielectric and layer deposition of a highly doped semiconductor, for example polycrystalline silicon and/or metal layer(s).

Figure 2J:
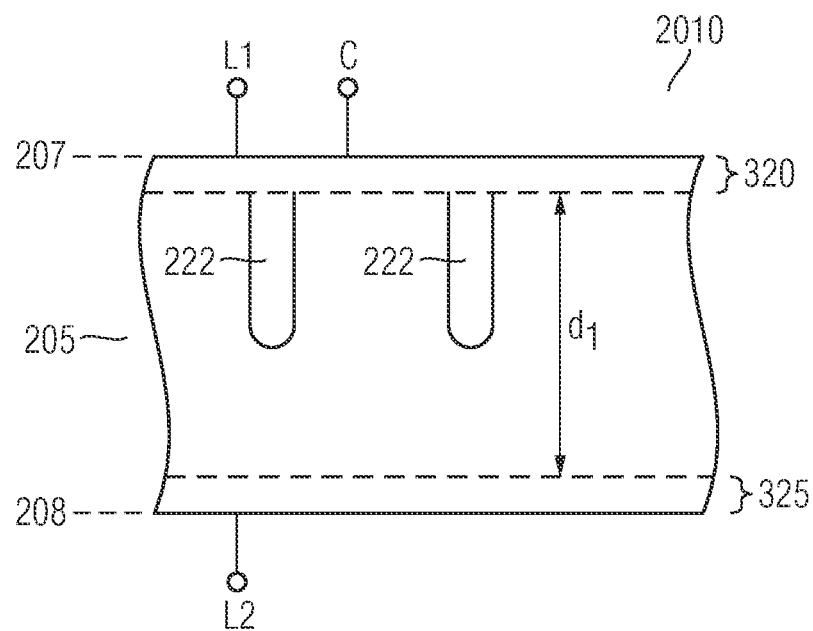

FIG. 2J is a schematic cross-sectional view 2010 of a portion of a vertical semiconductor device. Manufacturing of the vertical semiconductor device includes the process features described above with reference to FIGS. 2A to 2I.

The vertical semiconductor device includes a first load terminal structure 320 at the first surface 207, e.g. front surface of the semiconductor body 205. The first load terminal structure 320 includes doped semiconductor region(s). The doped semiconductor region(s) may be formed by doping processes of the semiconductor body 205 at the first surface 207, e.g. by diffusion and/or ion implantation processes. The doped semiconductor region(s) in the semiconductor body 205 of the first load terminal structure 320 may include doped source and body regions of a super-junction FET or a super-junction IGBT or a super-junction thyristor. The doped region 222 is part of the super-junction structure and may act as a charge compensation region, for example. In the course of processing the semiconductor body 205 at the first surface 207, a control terminal structure such as a planar gate structure and/or a trench gate structure including gate dielectric(s) and gate electrode(s) may be formed.

The vertical semiconductor device further includes a second load terminal structure 325 at a second surface 208, e.g. a rear surface of the semiconductor body 205 opposite to the first surface 207. The second load terminal structure 325 includes doped semiconductor region(s). The doped semiconductor region(s) may be formed by doping processes of the semiconductor body 205 at the second surface 208, e.g. by diffusion and/or ion implantation processes. The doped semiconductor region(s) in the semiconductor body 205 of the second load terminal structure 325 may include doped field stop region(s), doped drain regions of a vertical super-junction FET, or an emitter of a vertical super-junction IGBT, or an anode or cathode region of a vertical super-junction thyristor, for example.

A first electrical load terminal contact L1 to the first load terminal structure 320 and an electrical control terminal contact C to a control terminal structure, are part(s) of a wiring area above the first surface 207. A second electrical load contact L2 to the second load terminal structure 325 is provided at the second surface 208. The electrical load contacts L1, L2 and the electrical control terminal contact C may be formed of one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers and/or active area(s) in the silicon semiconductor body such as the first load terminal structure 320, for example. The patterned conductive layer(s) and interlevel dielectric layer(s) may form the wiring area above the semiconductor body 205 at the first surface 207, for example. A conductive layer, e.g. a metallization layer or metallization layer stack may be provided at the second surface 308, for example.

In another embodiment, a second gate control such as a planar gate structure and/or a trench gate structure including gate dielectric(s) and gate electrode(s) may be formed at the second surface 208 (bidirectional IGBT).

In the vertical semiconductor device illustrated in FIG. 2J, a current flow direction is between the first and second load terminal contacts L1, L2 along a vertical direction between the opposite first and second surfaces 207, 208.

The processes illustrated and described with reference to FIG. 1 and FIGS. 2A to 2J may also be applied to a silicon carbide semiconductor body. In addition, a single ion implantation process, for example only one of the process features S120 and S140 described with reference to FIG. 1 may be effectual for setting a desired vertical profile of dopants. Alternatively, two implantation processes may be sufficient to obtain a desired vertical doping profile, one implantation process being applied to the filling material close to the trench bottom and the other implantation process being applied to the filling material close to the surface of the semiconductor body. This is due to much smaller diffusion coefficients of dopants in silicon carbide than in silicon, i.e. the diffusion temperature for the dopant distribution in the filling material may be chosen much higher than for silicon because lateral in-diffusion into the semiconductor material is rather small. Removal of part of the filling material and repetition of the implantation and refill steps may thus be omitted. Diffusion of dopants from the filling material into the silicon carbide semiconductor body may be controlled via a solid solubility limit since solubility of the dopants in the filling material such as oxide is substantially greater than in silicon carbide. This results in a beneficial control and reproducibility of the dopant dose in-diffused into a SiC semiconductor body FIG. 3 is a schematic flow diagram for illustrating a method 100 of manufacturing a semiconductor device.

It will be appreciated that while method 300 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Figure 3:
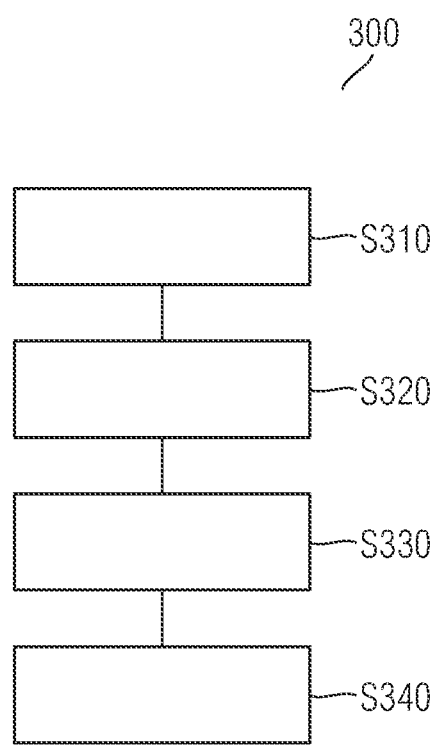
FIG. 3 is a schematic flow diagram for illustrating a method of manufacturing a silicon carbide semiconductor device.

A schematic flow diagram for illustrating a method 300 of manufacturing a semiconductor device is depicted in FIG. 3.

Process feature S300 comprises forming a trench in a silicon carbide semiconductor body at a first surface of the semiconductor body.

Process feature S310 comprises forming a filling material in the trench.

Process feature S320 comprises introducing dopants into a part of the filling material.

Process feature S330 comprises thermal processing of the silicon carbide semiconductor body configured to spread the dopants in the filling material along a vertical direction between a bottom side and a top side of the trench by a diffusion process. Temperatures during thermal processing described with reference process feature S330 (temperature or average temperature $T_1$) and subsequent additional thermal processing (temperature or average temperature $T_2$) for diffusing dopants into the SiC semiconductor body may differ from each other, for example $T_1 < T_2$ may be fulfilled, $T_2 - T_1 > 100K$, or $T_2 - T_1 > 250K$, or $T_2 - T_1 > 400K$.

Process feature S340 comprises introducing the dopants from the filling material into the silicon carbide semiconductor body by a diffusion process caused by thermal processing of the silicon carbide semiconductor body at the temperature $T_2$.

Although specific embodiments have been illustrated and described herein, it will be appreciated by those of ordinary skill in the art that a variety of alternate and/or equivalent implementations may be substituted for the specific embodiments shown and described without departing from the scope of the general inventive concept. This application is intended to cover any adaptations or variations of the specific embodiments discussed herein. Therefore, it is intended to be limited only by the claims and the equivalents thereof.

What is claimed is:

1. A method of forming a semiconductor device, the method comprising:
    forming a trench in a semiconductor body at a first surface of the semiconductor body;
    at least partially filling the trench with a filling material, the filling material having a bottom side and a top side;
    introducing dopants into a portion of the filling material to form a doped filling material, wherein the dopants have a first diffusion coefficient relative to the filling material and have a second diffusion coefficient relative to the semiconductor body, wherein the first diffusion coefficient is greater than the second diffusion coefficient;
    applying a first thermal processing to the doped filling material, the first thermal processing having a first temperature profile configured to spread the dopants within the doped filling material along a vertical direction between the bottom side and the top side of the doped filling material by a diffusion process, thereby shaping a vertical doping profile of the dopants within the doped filling material, wherein the first temperature profile is configured such that the dopants are substantially confined to within the trench and substantially do not diffuse from the doped filling material into the semiconductor body during the first thermal processing; and
    subsequent to applying the first thermal processing, applying a second thermal processing to the semiconductor body configured having a second temperature profile to cause diffusion of the dopants from the doped filling material having the shaped vertical doping profile into a region of the semiconductor body adjoining the trench, wherein the diffused dopants from the filling material cause counter-doping of the semiconductor body, and
    wherein introducing the dopants into the portion of the filling material to form the doped filling material includes introducing the dopants at different vertical depths within the filling material inside the trench.

2. The method of claim 1, wherein a diffusion coefficient ratio of the first diffusion coefficient to the second diffusion coefficient is greater than 10 to suppress out-diffusion of the dopants from the doped filling material to the semiconductor body during the first thermal processing.

3. The method of claim 1, wherein the semiconductor body is silicon carbide.

4. The method of claim 1, wherein the dopants include at least one of boron or gallium.

5. The method of claim 1, wherein the semiconductor body is a silicon carbide semiconductor body and the dopants comprise at least one of boron or gallium.

6. The method of claim 5, wherein the filling material is silicon oxide.

7. The method of claim 5, wherein the filling material is polycrystalline silicon.

8. The method of claim 7, further comprising:
    prior to at least partially filling the trench with the filling material, depositing a dielectric liner that lines sidewalls and a bottom of the trench, and
    recrystallizing the filling material resulting in dissipation of the dielectric liner.

9. The method of claim 1, further comprising:
    prior to at least partially filling the trench with the filling material, forming a diffusion barrier that lines sidewalls and a bottom of the trench.

10. The method of claim 9, wherein the diffusion barrier is a layer or a layer stack comprising a nitride.

11. The method of claim 1, wherein the semiconductor body is a silicon semiconductor body, and a temperature or average temperature $T_1$ applied during the first thermal processing and a temperature or average temperature $T_2$ applied during the second thermal processing satisfy $T_1 - T_2 > 50$ kelvin, where $T_1$ is greater than $T_2$.

12. The method of claim 1, wherein the semiconductor body is a silicon carbide semiconductor body, and a temperature or average temperature $T_1$ applied during the first thermal processing and a temperature or average temperature $T_2$ applied during the second thermal processing satisfy $T_2 - T_1 > 100$ kelvin, where $T_2$ is greater than $T_1$.

13. The method of claim 1, wherein the first thermal processing and the second thermal processing are separate processing steps that have different temperature profiles.

14. The method of claim 1, further comprising:
    prior to at least partially filling the trench with the filling material, introducing the dopants into the region of the semiconductor body adjoining the trench.

15. The method of claim 14, further comprising:
    prior to at least partially filling the trench with the filling material, forming a diffusion barrier that lines a first sidewall, a second sidewall, and a bottom of the trench;

wherein at least partially filling the trench with the filling material includes providing the filling material on the diffusion barrier such that the diffusion barrier is interposed between the filling material and the semiconductor body.

16. The method of claim 1, wherein applying the first thermal processing to the doped filling material shapes the vertical doping profile of the doped filling material to have a substantially constant dopant concentration vertically throughout the doped filling material.

17. The method of claim 16, wherein prior to applying the first thermal processing to the doped filling material, the vertical doping profile of the doped filling material has at least one concentration peak at at least one vertical depth of the doped filling material.

18. The method of claim 1, wherein, subsequent to applying the second thermal processing, the method further comprises:
  removing the filling material from the trench; and
  subsequent to removing the filling material from the trench, filling the trench with a semiconductor material.

19. A method of forming a semiconductor device, the method comprising:
  forming a trench in a semiconductor body at a first surface of the semiconductor body;
  at least partially filling the trench with a filling material, the filling material having a bottom side and a top side;
  introducing dopants into a portion of the filling material to form a doped filling material, wherein the dopants have a first diffusion coefficient relative to the filling material and have a second diffusion coefficient relative to the semiconductor body, wherein the first diffusion coefficient is greater than the second diffusion coefficient, and wherein a diffusion coefficient ratio of the first diffusion coefficient to the second diffusion coefficient is greater than 10 to suppress out-diffusion of the dopants from the doped filling material to the semiconductor body during a first thermal processing;
  applying the first thermal processing to the doped filling material, the first thermal processing configured to spread the dopants within the doped filling material along a vertical direction between the bottom side and the top side of the doped filling material by a diffusion process, thereby shaping a vertical doping profile of the dopants within the doped filling material, wherein the diffusion coefficient ratio suppresses out-diffusion such that the dopants are confined to within the trench and substantially do not diffuse from the doped filling material into the semiconductor body during the first thermal processing; and
  subsequent to applying the first thermal processing, applying a second thermal processing to the semiconductor body configured to cause diffusion of the dopants from the doped filling material having the shaped vertical doping profile into a region of the semiconductor body adjoining the trench, wherein the diffused dopants from the filling material cause counter-doping of the semiconductor body, and
  wherein the filling material is at least one of silicon oxide or polycrystalline silicon.

20. The method of claim 19, wherein the first thermal processing and the second thermal processing are separate processing steps that have different temperature profiles.

21. The method of claim 19, wherein, subsequent to applying the second thermal processing, the method further comprises:
  removing the filling material from the trench; and
  subsequent to removing the filling material from the trench, filling the trench with a semiconductor material.

22. The method of claim 21, wherein the semiconductor material is formed inside the trench by an epitaxial growth process.

* * * * *